United States Patent [19]

Zacher et al.

[11] Patent Number: 4,800,462
[45] Date of Patent: Jan. 24, 1989

[54] ELECTRICAL KEYING FOR REPLACEABLE MODULES

[75] Inventors: A. Richard Zacher, Los Gatos; Jay A. Zwagerman, Saratoga; Francis J. Dwan, Gilroy, all of Calif.

[73] Assignee: Tandem Computers Incorporated, Cupertino, Calif.

[21] Appl. No.: 40,454

[22] Filed: Apr. 17, 1987

[51] Int. Cl.$^4$ ............................................. H01R 23/68
[52] U.S. Cl. ..................................... 361/413; 364/708
[58] Field of Search ................ 364/708; 361/400, 412, 361/413

[56] References Cited

U.S. PATENT DOCUMENTS

| | | | |
|---|---|---|---|
| 3,993,935 | 11/1976 | Philips et al. | 361/413 |
| 4,454,552 | 6/1984 | Barnes et al. | 361/413 |
| 4,514,786 | 4/1985 | Charruau | 361/413 |
| 4,546,414 | 10/1985 | Donges | 361/413 |
| 4,575,780 | 3/1986 | Brombal et al. | 361/413 |
| 4,658,333 | 4/1987 | Grumes | 361/413 |

Primary Examiner—Gary V. Harkcom
Assistant Examiner—Dale M. Shaw
Attorney, Agent, or Firm—Townsend & Townsend

[57] ABSTRACT

An electrical keying system for a set of incompatible module pairs to prevent powerup of an electrically incompatible module pair in a set.

2 Claims, 2 Drawing Sheets

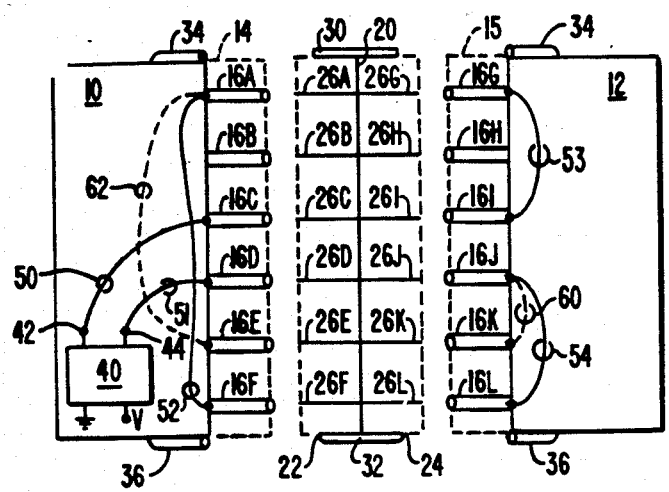
FIG._1.
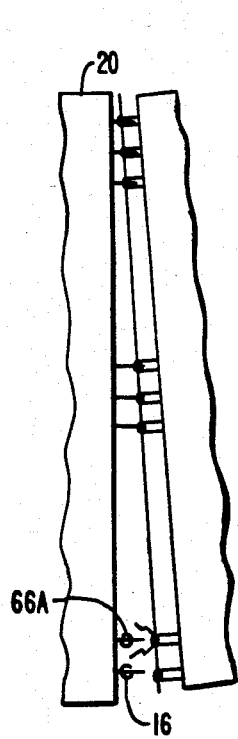
FIG._3.
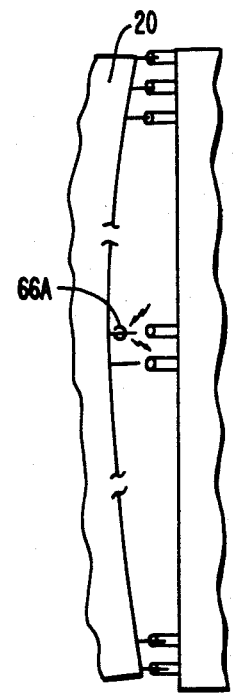
FIG._4.

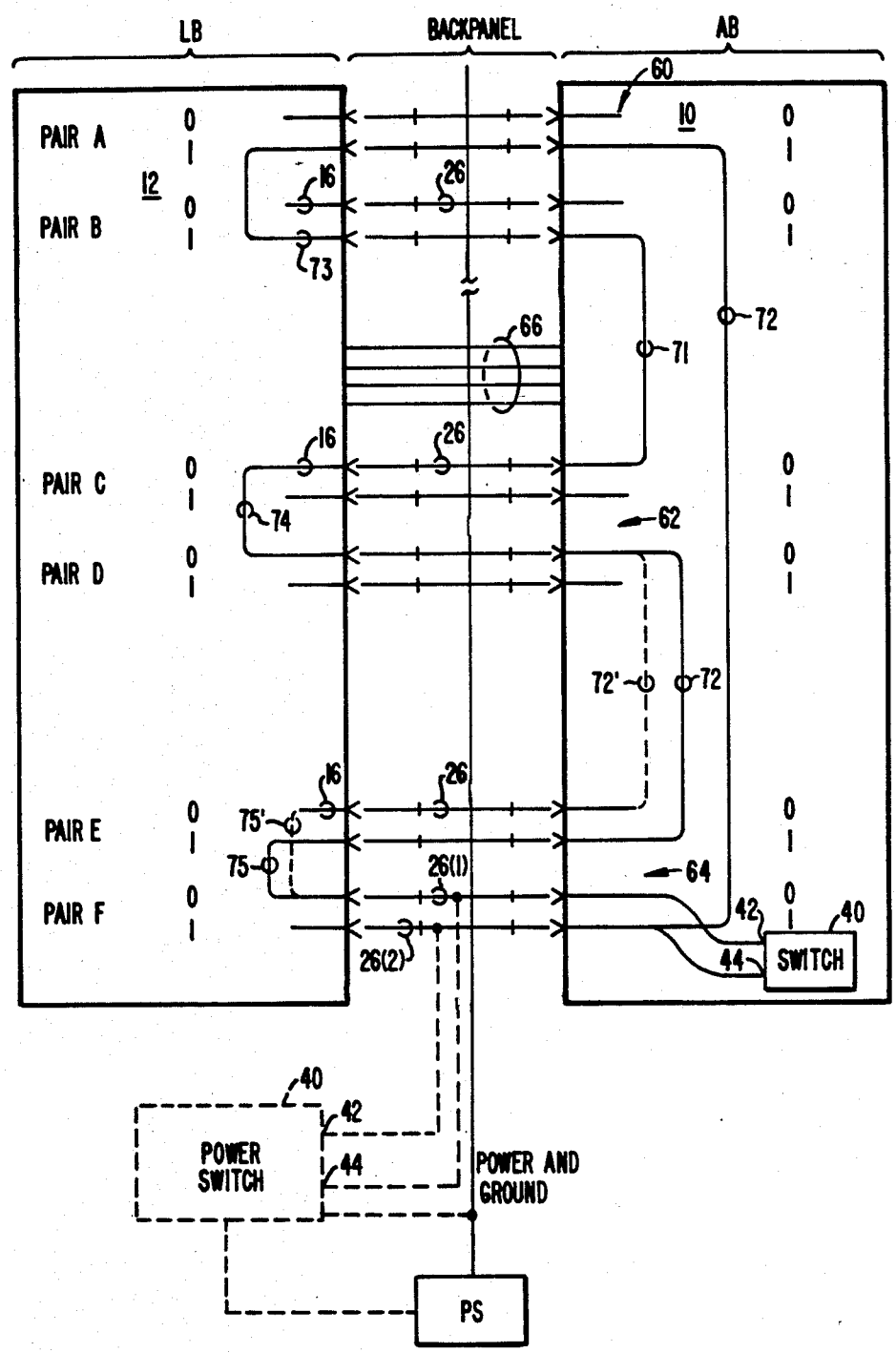
FIG._2.

ELECTRICAL KEYING FOR REPLACEABLE MODULES

BACKGROUND OF THE INVENTION

A typical computer system includes a cabinet which houses a number of replaceable modules. These modules may include power supplies, fans, mass storage devices, central processing units, and controllers for input-output devices. Repair of the system is usually effected by removing a defective module and replacing it with a correctly functioning module of the same type. In some kinds of systems which incorporate redundant modules, one part of the system can be repaired while the rest of the system is functioning; then the repaired part can be reintegrated without ever shutting down the system.

When modules are replaced, it is essential that the replacement module be of the correct type. If a module of one type is inserted into a site designed for a module of a different type, damage may occur to the module or to the rest of the system.

In many cases, differences in shape between modules preclude insertion of one type of module into a site not designed for it. For example, a disc unit and a power supply typically are of very different shapes and have electrical connectors which are physically incompatible, so it may be impossible to insert one into a slot designed for the other in such a way as to cause damage. On the other hand, other types of modules may be designed to be physically similar for reasons of economy. In particular, electronic modules realized as assemblies of components mounted on printed wiring boards may be designed in a standard form to plug into physically identical slots in a common housing, or card cage. Because the connections to modules of different types may differ, a potential for damage exists if a module can be plugged into a slot not designed for it.

One way of avoiding such damage is to provide mechanical keying on the slots of the card cage. The plug-in modules have complementary keying, designed so that a module can plug only into a slot designed for it. This scheme works well in certain portions of a computer system where a given slot is intended to accept only one type of module. It can also work for portions of the system where slots are designed to accommodate any of several different types of modules. For example, a section of a card cage may contain several slots set aside for modules which control input/output (I/O) devices. The types and numbers of I/O devices may vary from system to system, so the slots in this section may be designed to accommodate any of the controller modules. All I/O controller modules would be keyed alike to prevent their insertion into slots not designed for I/O controllers, and to allow their insertion into any I/O controller slot. Other modules would be keyed to prevent their insertion into the I/O controller slots.

A problem arises if modules in this I/O controller section are paired. In one scheme, for example, each I/O controller comprises two modules: one which contains most of the logic circuitry of the controller, and another which holds specialized interface circuitry and connectors for connection to a device or communication line of a specific type. For clarity, designate the first type of module the LB (for Logic Board) and the second type of module the AB (for Adapter Board). There may be several types of LB, each compatible with several types of AB; however, an AB compatible with a particular LB type is incompatible with all other LB types. The problem is that if an LB and an incompatible AB are plugged into paired slots, damage may result when power is applied to the circuitry on either board.

Further, when connection is made between the boards and power and signal connectors, arcing or power supply voltage drop may cause damage to the boards or loss of data.

Accordingly, a system for preventing powerup when an incompatible board pair is interconnected would be of great utility. Further, it would be useful for the system to prevent arcing and loss of data during interconnection.

SUMMARY OF THE INVENTION

The present invention is an electromechanical interconnect system for interconnecting a module pair, of a set of pin-compatible module pairs, that prevents power-up of an interconnected pair if the modules in the pair are electrically incompatible.

In a preferred embodiment, the connector arrays include keying connectors, The first module includes a controllable switch, having two control terminals, that provides power to an interconnected module pair only if the two terminals are conductively connected. Each terminal is connected to a keying connector in first module connector array.

The keying connectors on the various modules are coupled so that the control terminals are conductively connected when electrically compatible modules are interconnected, to supply power to the modules, and so that the control terminals are not conductively connected if the interconnected modules are incompatible, to prevent the supply of power to the modules.

In one embodiment, at least one keying connector is included in an upper, center, and lower row of keying connectors to prevent arcing between power or signal connectors due to geometrical misalignment or backpanel bowing.

In another embodiment, the controllable switch is not on either module.

Other advantages and features of the invention will be apparent in view of the drawings and following detailed description.

BRIEF DESCRIPTION OF THE DRAWINGS

FIG. 1 is a schematic diagram illustrating the operation of the electrical keying system of the invention.

FIG. 2 is a schematic diagram of a preferred embodiment of the invention.

FIG. 3 is a side view depicting geometrical misalignment.

FIG. 4 is a side view depicting backpanel bowing.

DETAILED DESCRIPTION OF THE PREFERRED EMBODIMENTS

Referring now to the drawings, where like reference numerals indicate identical or corresponding parts throughout the several views, FIG. 1 is a schematic diagram illustrating the electrical keying system of the invention. In FIG. 1, a module pair comprises first module 10 and second module 12. The first module includes a first module connector array 14 having six conductive receptacles 16A-F. Similarly, the second module includes a second module connector array 15 including six conductive receptacles 16G-L. A backpanel 20 has a first major face whereupon a first backpanel connector array 22 is mounted and a second major face whereupon a second backpanel conductor array 24 is mounted. Each backpanel array 22 and 24 includes six conductive pins 26A-F for the first array and 26G-L for the second array. The conductive pins 26 and conductive receptacles 16 are equally spaced so they may be mechanically and conductively mated when the first and second module connector arrays 14 and 15 are mechanically coupled to the backpanel conductor arrays.

Further, the backpanel 20 includes mechanical positioning pins 30 and 32 and the first and second module connector arrays 14 and 15 include mechanical receptacles 34 and 36.

The first module 10 includes a control regulator 40 that distributes power to the first and second modules, when they are interconnected via the backpanel 20, only if first and second control terminals 42 and 44 are electrically connected. The control regulator 40 is connected to an external power source via power and signal pins in the back panel arrays 14 and 15 and distributes power to the modules via other power and signal pins. The external power supply, signal and power pins and interconnections are not explicitly depicted in FIG. 1 but are realized in a standard manner.

The first module 10 includes wiring path 50 connecting conductive receptacle 16C with the first terminal of the regulator 42 and wiring path 51 connecting receptacle 16D to the second terminal of the regulator 44. Additionally, the first module includes wiring path 52 coupling the first conductive receptacle 16A with the sixth conductive receptacle 16F. The second module 12 includes wiring path 53 coupling the seventh conductive receptacle 16G with the ninth conductive receptacle 16I and wiring path 54 connecting the tenth conductive receptacle 16J to the twelfth conductive receptacle 16L. Typically, these wiring paths 50-54 are circuit lines etched on a printed circuit board.

The conductive pins 26, in the first and second backpanel conductive modules 14 and 15, disposed opposite from each other, e.g., pins 26A and 26G, are electrically connected through the backpanel 20.

The operation of the electrical keying system will now be described. For the wiring system described above, when the receptacles in the first and second module connectors 14 and 15 are mechanically connected to corresponding pins 26 in the backpanel connectors 22 and 24, a complete circuit from first terminal 42 through pin 16C, 16I, 16G, 16A, 16F, 16L, 16J, 16D back to second terminal 44 is completed. Accordingly, a circuit is formed between first and second terminals 42 and 44 and the regulator 40 provides power to the interconnected module pair.

The above-described wiring system is thus appropriate in the case where the first and second modules 10 and 12 are compatible. The wiring pattern provides for application of power when the conductive receptacles 16 are mated to the conductive pins 26. On the other hand, if wiring path 54 were removed and replaced by the wiring path indicated by the dotted line 60 then a complete circuit would not be formed between first and second terminals 42 and 44 when the receptacles 16 and pins 26 were mated. This wiring scheme would be appropriate for a first and second module that were not compatible because power would not be applied to the module pair when the receptacle 16 and pins 26 were mated. However, if the wiring path 52 on the first module was replaced by the wiring path indicated by the dotted line 62 then a completed circuit would be formed between first and second terminals 42 and 44 and power would be applied to the module pair.

Thus, a system for keying different module pairs has been described. Note that all modules are mechanically compatible with the backpanel connector arrays. However, by varying the wiring paths on the first and second modules 10 and 12 the modules are keyed so that power may only be applied to compatible modules.

FIG. 2 is a schematic diagram of a preferred embodiment of the invention. The keying receptacles 16 are disposed in three keying rows, an upper row 60 positioned near the top of the backpanel 20, a center row 62 positioned near the center of the backpanel 20, and a bottom row 64 positioned near the bottom, of the backpanel 20. Similarly, the keying pins 26 are disposed in corresponding upper, middle, and lower keying rows in the first and second module connector arrays 14 and 15. Also disposed along the backpanel 20 are multiple rows of signal and power pins 66. The power and signal pins 66 are longer than the keying pins 16. The keying pins 16 and receptacles 26 are grouped into adjacent pairs 68.

In FIG. 2, the receptacles in each matched pair 68 are labelled by the binary digits 0 and 1. In each module, one of the receptacles in each matched pair 68 is connected to another receptacle in another matched pair by wiring paths 70-75.

For a compatible module pair, as shown in FIG. 2, these wire paths form a wiring path between first and second switch terminals 42 and 44 when the receptacles 16 are mated to the pins 26.

For an incompatible module pair, these wire paths would not form a wiring path between the switch terminals 42 and 44. For example, if in FIG. 2, assume wire path 72 were in the first module 10 were replaced by wire path 72', (dotted line), a complete circuit would not be formed when the modules 10 and 12 were interconnected via the backpanel 20.

However, if, in the second module 12, wire path 75 were replaced by wire path 75', a second compatible pair would be formed.

Alternatively, as shown in phantom in FIG. 2, the regulator 40 may be external to the interconnect system. In that case, the control terminals 42 and 44 are coupled to given pair of keying pins 26(1) and 26(2), The wiring paths on the first and second modules 10 and 12 form a wiring path between the given pair of keying pins 26(1) and 26(2) only if the module pair 10 and 12 is electrically compatible.

The receptacles in the first and second module connectors are all of the same length and are geometrically arranged so that each pin mates with a corresponding receptacle when the first and second modules 10 and 12 are connected via the backpanel connectors 22 and 14. Because the signal and power pins 66 are longer than the keying pins 16 the electrical connections between the receptacles in the module connectors and the signal and power pins 66 are made before the electrical connections between the keying pins 16 and the receptacles. Thus, no power is applied before the mechanical connection between the signal and power pin 66 and the associated receptacles and, therefore, the problem of arcing between the power pins 66 and receptacles is obviated.

Further, the regulator 40 provides for a linear ramping of the initial voltage applied to the boards so that there is no current surge that could cause the power supply output voltage to drop when the boards are first interconnected. Thus, there is no danger that data stored on other boards supplied by the power supply will be lost.

The wiring paths described above in FIG. 1 are depicted in analogous form for FIG. 2. Note that for each module, three keying pin pairs are connected. At least one of these connecting keying pin pairs must be in each of the keying pin rows 60, 62 and 64. This prevents accidental powerup if the modules are geometrically misaligned during the mechanical mating of the pins and receptacles or if the backpanel has become warped or bowed. These effects are illustrated in FIGS. 3 and 4.

In FIG. 3, assume that all of the keying pins 16 necessary to complete the keying circuit were in the upper keying pin row 60. The second module 12 is misaligned during the mechanical mating step so that the keying circuit is completed prior to the interconnection of power pin 66A with its corresponding receptacle 16 in the second connector array 24. Since power has been applied due to the completion of the keying circuit, there may be an arc between the power pin and the receptacle. In FIG. 3, the misalignment angle has been greatly exaggerated to illustrate the effect. However, typically the difference between the short and long pins is only 40 mils so that a minor misalignment could lead to the effect described.

However, if one of the keying pins is in the lower row 64 then power will not be supplied until this pin is mated, where this mating occurs after the signal and power pin 66A has been mated.

In FIG. 4, assume that all of the keying pins required to complete the powerup circuit are in the upper and lower keying row 60 and 64, The backpanel is bowed so that the upper and lower rows of keying pins are connected to complete the powerup circuit before a power pin 66A near the center of the connector is connected to its corresponding receptacle 26 in the first module connector array 22. Thus, an arc may develop between the power pin 66A and its associated receptacle. Again, as in FIG. 3, the drawing has been exaggerated to show the effect.

However, if one of the keying pins is in the middle row 62, then power will not be supplied until this pin is mated, where this mating occurs after power and signal pin 66A is mated.

The invention has now been described with reference to a preferred embodiment, Substitutions and modifications will now be apparent to those skilled in the art. In particular, the distribution of pins and receptacles between the module connectors and backpanel connectors is not material to the invention. Any combination of pins and receptacles, or any other type of mechanically mating contacts on either connector could be utilized to practice the invention. Further, the short/long relationship between the keying interconnect system and the signal and power interconnect system may be implemented by various combinations of short and long pins and receptacles. For the embodiment having upper, middle, and lower keying rows, if one keying pin in each row is shorter than the signal and power pins, then the advantages regarding arcing and data preservation will be realized. Accordingly, it is intended that the invention not be limited except as provided by the appended claims.

We claim:

1. In an electromechanical interconnect system of the type interconnecting a pair of modules via a backpanel, with the backpanel having an array of connectors disposed thereon, with each module having a module array of connectors mechanically compatible with the backpanel array, and with the backpanel for mechanically and electrically interconnecting the connectors on the pair of modules, with a first module in the pair selected from a first set of modules and second module in the pair selected from a second set of modules, with some of the modules in the first set being electrically incompatible with modules in the second set in the sense that damage to the electrically incompatible modules would result if the electrically incompatible modules were interconnected via the backpanel and a power supply control regulator circuit coupled to a pair of control regulator terminals were closed so that power was applied to the modules, a subsystem for assuring that power cannot be applied to a given pair of interconnected modules unless the first and second modules in the given pair are electrically compatible modules, said subsystem comprising:

a first set of keying connectors included in the array of connectors of the first module of the given pair of modules;

means for electrically connecting the pair of control regulator terminals to the connectors of a first selected pair of keying connectors in said first set, with a first control regulator terminal connected to a first keying connector and a second control regulator terminal connected to a second keying connector in said first selected pair of keying connectors;

means for connecting selected other pairs of keying connectors in said first set, with said connected pairs in said first set forming a first wiring pattern;

a second set of keying connectors included in the array of connectors of the second module of the given pair of modules;

means for connecting selected pairs of keying connectors in the second set, with said connected pairs forming a second wiring pattern, with said first and second wiring patterns forming a closed circuit between the pair of control regulator terminals when the modules in the given pair are interconnected only if the modules in the given pair are electrically compatible thereby preventing powerup and possible resulting damage when a pair of electrically incompatible modules are inadvertently interconnected.

2. The system of claim 1 wherein:

the module arrays are substantially rectangular and at least one of said keying connectors in said first set is disposed near the top of the module array, at least one of said connectors in the first set is disposed near the center of the module array, and at least one of said keying connector in said first set is disposed near the bottom of the module array to prevent arcing during power up due to a bowed backpanel or misalignment during interconnection.

* * * * *